United States Patent [19]

Carmichael et al.

[11] Patent Number: 4,837,721

[45] Date of Patent: Jun. 6, 1989

[54] DIGITAL DIVIDER WITH INTEGER AND FRACTIONAL DIVISION CAPABILITY

[75] Inventors: Philip D. Carmichael, Closter; Thomas E. Finley, Pompton Lakes, both of N.J.

[73] Assignee: ITT Defense Communications, A Division of ITT Corporation, Nutley, N.J.

[21] Appl. No.: 880,405

[22] Filed: Jun. 30, 1986

[51] Int. Cl.⁴ .......................... G06F 7/52; H03K 21/00
[52] U.S. Cl. ........................................ 364/703; 377/48
[58] Field of Search .................. 364/703, 761–767, 364/701; 377/47–48

[56] References Cited

U.S. PATENT DOCUMENTS 3,446,947  5/1969  Overstreet, Jr. ................ 364/703
3,873,815  3/1975  Summers ........................ 364/703
4,295,158  10/1981  Nissen et al. .................... 377/48 X
4,494,243  1/1985  Elmis ............................. 364/703

FOREIGN PATENT DOCUMENTS 2753453  4/1979  Fed. Rep. of Germany .

Primary Examiner—Gary V. Harkcom
Assistant Examiner—Long T. Nguyen
Attorney, Agent, or Firm—Robert A. Walsh; Thomas N. Twomey; Mary C. Werner

[57] ABSTRACT

A digital divider with both integral and fractional division capabilities is provided by utilization of a counter and one decoder to trigger phase reversal and a second decoder to trigger short-cycling of the counter. The first decoder provides phase reversal to cause extra half pulses during the period established by the second decoder to thus create the fractional count needed for fractional division. A control input is included to select either whole number division or fractional division.

17 Claims, 2 Drawing Sheets

DIGITAL DIVIDER WITH INTEGER AND FRACTIONAL DIVISION CAPABILITY

The Government has rights in this invention pursuant to a Contract No. N00039-84-C-0403 with the Department of the Navy.

BACKGROUND OF THE INVENTION

1. Field of the Invention

The present invention relates to digital division of electrical signals by both integer and fractional division ratios. Fractional division is particularly important in digital data transmission and in the transmission of digitized voice, both of which are clocked from a common timing source and which require a plurality of lower frequency rates, some of which may be fractional rates.

2. Description of the Prior Art

Digital divider circuits of the prior art typically are capable of whole integer binary or decade division of an electrical signal into a plurality of divided down signals at lower frequency rates. An example of a conventional whole number digital divider is a standard synchronous presettable binary counter such as the Fairchild Semiconductor 54F/74F161A or 54F/74F163A high-speed synchronous modulo-16 binary counters. This standard component has the capability of receiving an input clock and generating lower frequency clocks at $\frac{1}{2}$, $\frac{1}{4}$, $\frac{1}{8}$, and 1/16 the input clock frequency. This prior art synchronous presettable counter also enables the presetting of selectable states out of the normal order to obtain various combinations of whole integer division of an input timing signal.

It is also known in the prior art that by changing the phase of the incoming timing signal that the clock rate will be affected. Various circuits utilizing a plurality of digital components have been devised in the known prior art to accomplish digital division by a fractional number. All of the known prior art techniques involve complex logic circuitry having a large number of components and tend to result in assymetric signals after the fractional division is accomplished; that is, instead of a well defined squarewave or near squarewave, the fractionally divided down signal may consist of logic pulses of approximately 20% up (high) and 80% down (low) or vice versa.

In the prior art, separate circuits are used, for example, for a divide-by-4 and divide-by-4.5 operation. The divide-by-4 circuit can be a standard 2-bit counter available off-the-shelf while the divide by 4.5 circuit may typically consist of a 5-bit Johnson counter whose fifth bit is used to control the counter through other logic circuitry such that the count is shortened by a $\frac{1}{2}$ clock period each 5 counts, causing the Johnson counter to divide by 9 instead of the normal 10.

It is, therefore, an object of the present invention to provide a simple digital circuit for effecting fractional digital division of an incoming timing or clock signal with a selectable division ratio, low power dissipation, and a substantially reduced number of electrical components.

It is an additional object of the present invention to obtain a fractional divided down output signal as close to symmetric as possible. Such symmetry is important in data transmission; particularly for a timing signal, since the sampling edge of a clock should be approximately in the center of the data pulse to be sampled, otherwise noise rather than data could be sampled.

SUMMARY OF THE INVENTION

The present invention describes a digital division circuit for fractionally dividing an incoming timing or clock signal by a fractional value by means of manipulating the division operation of a counter by both presetting certain of the counter states out of their normal order and by selectively changing the phase of the incoming digital signal to be divided, prior to the midpoint of the timing signal cycle. It has been discovered that by using the combination of both presetting selection of the counter states out of their normal order and by selectively changing the input signal phase that not only is fractional division accomplished, but that the fractionally divided signals are generally symmetrical in nature so that they are useful as clock or timing signals in data processing and/or data transmission applications.

Other objects and advantages of the invention will become apparent with reference to the accompanying figures and detailed description thereof, wherein:

DESCRIPTION OF THE PREFERRED EMBODIMENT

Figure 1:
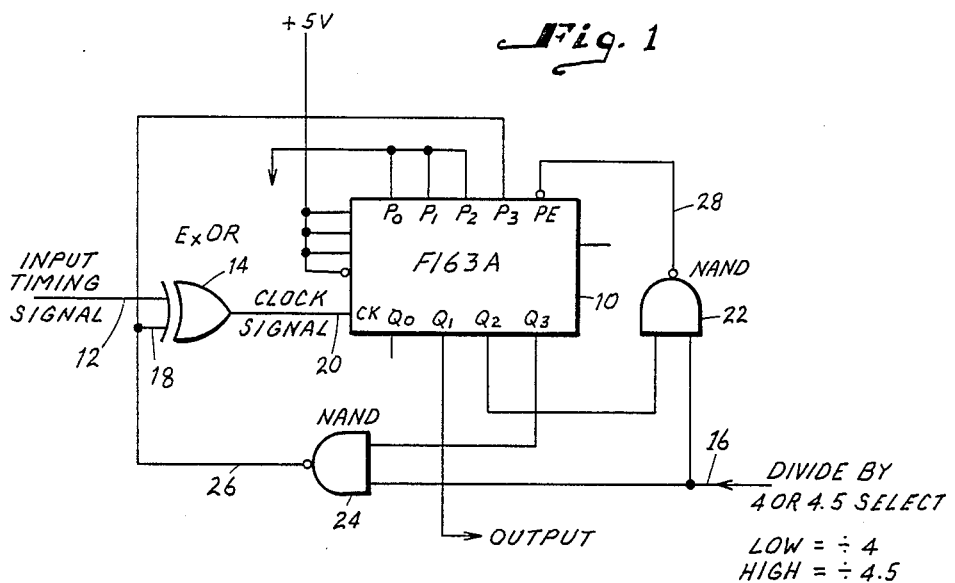
FIG. 1 is a circuit diagram of a divide by 4.5 circuit in accordance with the present invention.
Figure 2:
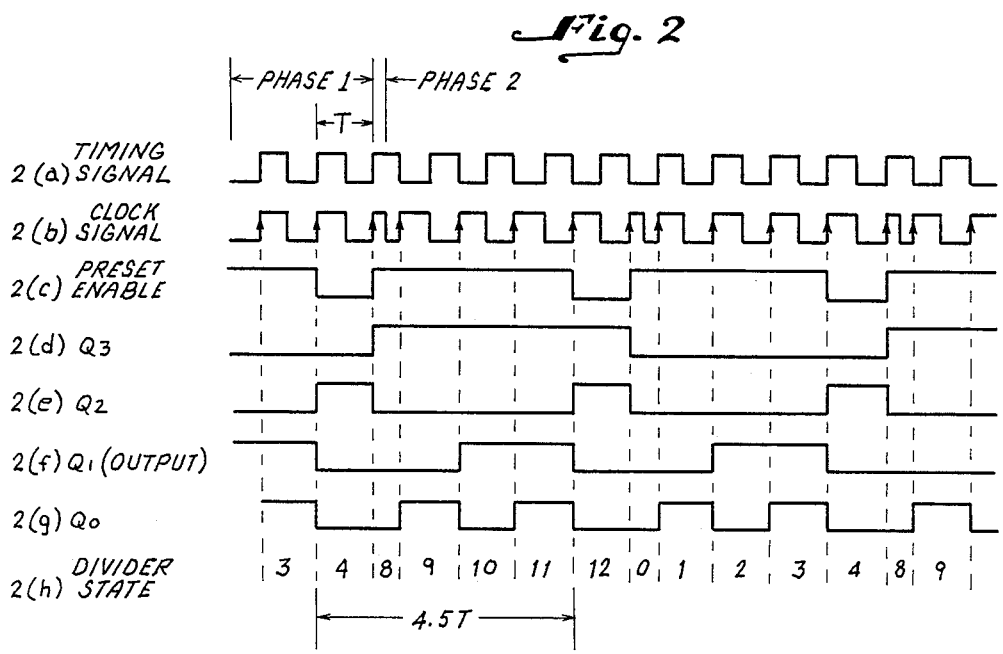
FIGS. 2(a), 2(b), 2(c), 2(d), 2(e), 2(f), 2(g), and 2(h) are waveform diagrams useful in explaining the operation of the circuit described with reference to FIG. 1.

Referring now to FIG. 1, a circuit in accordance with the present invention for dividing an input timing signal by a fractional divisor, in this example by 4.5, is illustrated. A binary counter such as synchronous presettable binary counter 10 which may be, for example, either a 54F163A or 74F163A, Fairchild Semiconductor MSI modulo-16 binary counter may be utilized. Any particular digital timing signal on line 12 is coupled to one input of an exclusive-OR gate 14. The input timing signal is illustrated by waveform 2(a), and may be, for example, an 18.432 megahertz squarewave. In normal operation the modulo-16 binary counter 10 is capable of selectively generating a plurality of divided down outputs at $Q_0$, $Q_1$, $Q_2$, and $Q_3$ of $\frac{1}{2}$ the frequency of the input timing signal at $Q_0$, $\frac{1}{4}$ of the input timing signal at $Q_1$, $\frac{1}{8}$ of the timing signal at $Q_2$, and 1/16 of the timing signal at $Q_3$. As will become evident, the parallel data inputs $P_0$, $P_1$, $P_2$, $P_3$ and the phase of the input timing signal can be selectively manipulated so as to vary the result of the input timing signal division. In essence, the specific division integer depends upon the output state selected out of its normal order and the fractional portion of the division depends upon the state at which a phase change of the input timing signal is initiated. The rate of the input timing signal is a fixed rate higher than the rate desired by the final divided down output rate. Exclusive-OR gate 14 either couples the input timing signal to its output or inverts the input timing signal in accordance with a control signal applied via line 16. The control signal is used to select either conventional divide-by-4 operation or the divide-by-4.5 operation of the invention. The timing signal from exclusive-OR gate 14 is applied to the counter 10 at its clock input at line 20 and is illustrated at FIG. 2(b) as the clock signal. The programmable divider integrated circuit 10 may be programmed to divide by integers 2–16 based on the use of its parallel data inputs $P_0$, $P_3$ and the PE (parallel enable) input. The present embodiment manipulates the signals applied to these inputs to selectively divide-by-4 or to divide-by-4.5 based upon the control signal applied at line 16 to the inputs of NAND gate 22 and NAND gate 24.

In the conventional divide by 4 operational mode, a selected signal at the logic "zero" level is applied to the input of NAND gates 22 and 24 via line 16. This condition forces the output of NAND gate 24 on line 26 and the output from NAND gate 22 on line 28 to the logic "one" state. The logic "one" state from line 26 to the input of exclusive-OR gate 14 via line 18 selects "phase one" from the timing source (the input to line 12, which may be any conventional clock generator and which in this instance supplies the 18.432 megahertz timing signal). This "phase one" has no affect at the parallel data input $P_3$ due to the fact that the logic "one" level from line 28 to the parallel enable input PE of counter 10 disables parallel entry of data on the parallel data inputs $P_0$, $P_1$, $P_2$, and $P_3$. The output signal in this mode from $Q_1$ is a squarewave which completes one cycle for each 4 cycles of every clock frequency at the clock input on line 20 to counter 10. The counter 10 enters the logic states 0–15 as described by the outputs $Q_3$, $Q_2$, $Q_1$, and $Q_0$. In binary representation, these states are:

| State | Binary |
|---|---|
| 0 | 0000 |
| 1 | 0001 |
| 2 | 0010 |
| 3 | 0011 |
| 4 | 0100 |
| 5 | 0101 |
| 6 | 0110 |
| 7 | 0111 |
| 8 | 1000 |
| 9 | 1001 |
| 10 | 1010 |
| 11 | 1011 |
| 12 | 1100 |
| 13 | 1101 |
| 14 | 1110 |
| 15 | 1111 |

Fractional division is enabled by impressing a logic "1" level to NAND gates 22 and 24 via line 16 by the control signal thereon to enable the NAND gates 22 and 24. The $Q_2$ output signal from divider 10 is controlled by NAND gate 22 via line 28 to the parallel enable PE input of counter 10. The $Q_3$ signals from counter 10 are controlled by NAND gate 24 to select the phase of the clock signal through the exclusive-OR gate 14 to the clock input at line 20 of counter 10. Assume the following initial conditions as an example of the circuit operation:

(1) The counter 10 is in the binary state 3 (0011).
(2) The exclusive-OR gate output is clock phase "1".

Operation continues with the counter 10 entering state 4 (0100) at the rising of the next clock phase "1" signal on the clock input 20 to counter 10. Once in the state 4, the output $Q_2$ is inverted through NAND gate 22 and enables the present enable function at the PE input of counter 10. Additionally, the $Q_3$ (logic zero) output of counter 10 appears inverted through NAND gate 24 at the preset $P_3$ input of counter 10. Upon arrival of the next rising phase "1" clock edge at the clock input 20 of counter 10, the present load forces the divider to state 8 (1000).

Two new actions now occur: the parallel load signal is terminated and the phase "two" of the clock signal is generated by the inversion of the timing signal through the exclusive-OR gate 14. Changing the phase of the clock signal at the clock input from line 20 causes another rising clock edge to terminate state 8 at approximately one-half period earlier than if the phase "1" timing were continued. This can be seen at FIG. 2(b) by the direction of the phase "2" arrows at the divider states indicated at FIG. 2(h). Additional phase "2" clock signals drive the divider through states 9, 10, 11, and 12. In state 12 (1100) the preset enable (PE) is again active and on the next clock edge the preset load forces the divider to the zero state (0000). The $Q_D$ signal inverted through NAND gate 24 causes the selection of the phase "1" clock signal. Changing the phase of the clock signal at the clock input on line 20 to the divider causes another rising clock edge to terminate state zero approximately one-half period earlier than if phase "two" timing were continued.

Additional clock pulses drive the divider to stated initial conditions and the process repeats. The input at pulse enable (PE) is shown at FIG. 2(c), and the divided down outputs of $Q_3$, $Q_2$, $Q_1$, $Q_0$ are shown at FIGS. 2(d), 2(e), 2(f), and 2(g) respectively. The desired output signal at $Q_1$, shown by FIG. 2(f), is available as a timing source with a period 4½ times the original reference signal. Also as can be seen the signal has approximately 55/45% symmetry and thus functions ideally as a data clocking signal. Additionally, the $Q_3$ output of the divider is available as a 50% duty cycle squarewave at nine times the period of the original reference signal.

Figure 3:
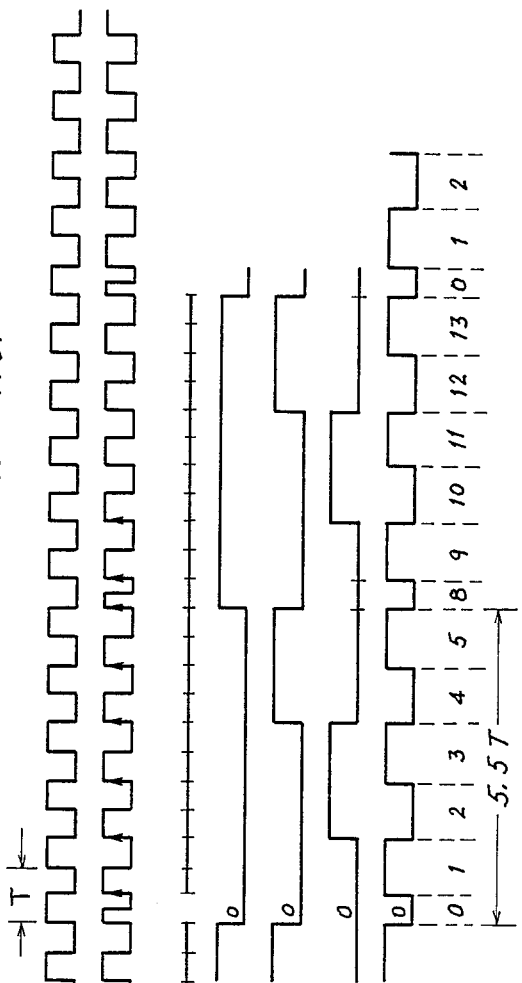
FIG. 3 is a circuit diagram of a divide by 5.5 circuit in accordance with the present invention.
Figure 4:
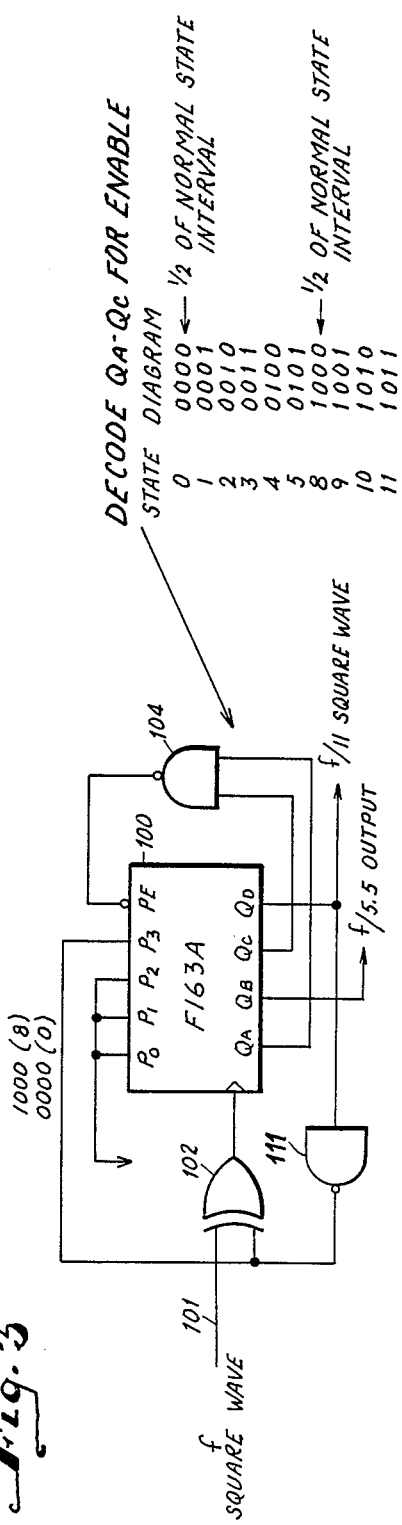
FIGS. 4(a), 4(b), 4(c), 4(d), 4(e), 4(f), 4(g), and 4(h) are waveform diagrams useful in explaining the operation of the circuit described with reference to FIG. 3.

Referring now to FIG. 3 and to the waveforms of FIG. 4(a) through 4(b), an additional embodiment of applicant's invention, illustrative of fractional division by 5.5 is illustrated.

A counter 100, which may be a binary counter, a decade counter, or a synchronous presettable counter of the same type as described with reference to the circuit of FIG. 1, may be used to divide down an input squarewave f on line 101 and which is illustrated at FIG. 4(a). In like manner as described with reference to FIG. 1, the counter 100 divides its input by ½, ¼, ⅛, and 1/16 to derive a plurality of whole integer division frequencies at $Q_A$, $Q_B$, $Q_C$, and $Q_D$, respectively. In accordance with applicant's invention, a circuit comprised of exclusive-OR gate 102 and NAND gate 104 is configured so as to both preset desired states of the counter 100 and to change the phase of the input timing signal at selected states, thereby changing the division of frequency f to a desired fractional division—in this example to f divided by 5.5 at the $Q_B$ output. An inverter 111 is provides the correct polarity for the signal going to input $P_3$. As can be seen on the state diagram associated with FIG. 3, states zero and eight are controlled at parallel data input $P_3$, and which is provided as an input to exclusive-OR gate 102 together with the input squarewave f. The preset is enabled when $Q_A$ and $Q_C$ are at a logic high via the NAND gate 104 output to the preset enable input PE. The clock phase approximately midway through states zero and eight is reversed as can be seen at FIG. 4(b), which causes the time duration of states zero and eight to be ½ of their normal interval and results in the waveform outputs of FIGS. 4(d), 4(e), 4(f), and 4(g) at flip-flop outputs $Q_3$, $Q_2$, $Q_1$, and $Q_0$ respectively of the counter during the divider states indicated at FIG. 4(h). Effectively the $Q_A$ and $Q_C$ outputs are decoded by NAND gate 104 to enable the preset enable as can been seen at FIG. 4(c). The result is an output at $Q_B$ of f divided by 5.5 and an output at $Q_D$ of an f divided by eleven squarewave. In this case the symmetry is approximately 60/40% which is an acceptable data clock signal. As can be seen, this fractional division operation is achieved by the simple means of effectively manipulating the states and phase of the signals which are already available and without the use of complex logic circuitry.

While the present invention has been described in connection with a preferred embodiment thereof, it is to be understood that the invention is not limited to the specific implementations, and that additional embodiments, modifications and application which will become obvious to those skilled in the art are included within the spirit and scope of the invention as set forth by the claims appended hereto.

We claim:

1. A fractional digital divider circuit comprising:
a counter having an input for receiving an input clock signal at a frequency f, a data input for presetting the counter to a desired state and a plurality of outputs including one output for providing a divided down counter output signal at a frequency f/n, where n is an integer;
first logic means connected to said counter for presetting selected states;
second logic means connected to said counter for receiving at one input of said second logic means an input digital signal and for receiving at another input of said second logic means a control signal, and for providing said input clock signal consisting either of said input digital signal or of said input digital signal with a phase reversal at said preset selected states, such that a period at each of said selected states of said counter is terminated in a shorter time duration than periods at states without said phase reversal, whereby said counter output signal frequency is fractionally divided at a frequency f/(n+m) where m is less than 1.

2. A fractional digital divider circuit in accordance with claim 1 wherein $m=\frac{1}{2}$.

3. A fractional digital divider circuit in accordance with claim 1, wherein said counter is a binary counter.

4. A fractional digital divider circuit in accordance with claim 3, wherein said counter is a high speed synchronous modulo-16 binary counter having a clock input, a plurality of parallel data inputs, a parallel enable input and a plurality of flip-flop outputs.

5. A fractional digital divider circuit in accordance with claim 4, wherein said second logic means for receiving said input digital signal comprises an exclusive-OR gate having said input digital signal applied to one input thereof and said control signal applied to the other input thereof.

6. A fractional digital divider circuit in accordance with claim 3, wherein the phase reversal of said input digital signal is initiated by said second logic means prior to one-half of the timing signal cycle.

7. A fractional digital divider circuit in accordance with claim 1, wherein said counter is a decade counter.

8. A fractional digital divider circuit in accordance with claim 1, wherein the phase reversal of said input digital signal is initiated by said second logic means prior to one-half of the timing signal cycle.

9. A fractional digital divider circuit in accordance with claim 1, wherein said input digital signal comprises a timing signal; and
wherein the output of said second logic means for receiving said input digital signal is applied to the input of said counter means.

10. A fractional digital divider circuit in accordance with claim 9, wherein said timing signal is a squarewave clock.

11. A fractional digital divider circuit in accordance with claim 1, wherein said control signal is externally generated, such that the counter output signal is selectably either at the frequency f/n or at the frequency f(n+m).

12. A fractional digital divider circuit in accordance with claim 1, wherein said control signal is generted in said counter, such that the counter output signal is always at the frequency f/(n+m).

13. A digital divider capable of integer and fractional division and operable to receive a digital timing signal as an input signal and to provide a digital output signal at a fractionally divided frequency relative to the frequency of the digital timing signal when a fractional division select signal is received, comprising:
counter means for receiving a clock signal at an input and generating said digital output signal,
signal inverting means for controllably inverting the phase of said digital timing signal in response to the receipt of a control signal to thereby provide said clock signal,
logic means for receiving said fractional division select signal and providing the control signal to said signal inverting means,
whereby, upon detection of a first logic condition on said fractional division select signal, said clock signal is the same as said digital timing signal, and whereby, upon detection of a second logic condition on said fractional division select signal, said clock signal is periodically reversed in polarity relative to said digital timing signal to cause an extra half period of said timing signal to be introduced into the period of said digital output signal for each polarity reversal.

14. A digital divider as claimed in claim 13 wherein:
said logic means comprises a NAND gate including first and second inputs and an output, said first input being connected to receive said fractional division select signal and said second input being connected to receive a second output signal from said counter, said second output signal being at an integrally divided down frequency relative to said digital output signal, and
said signal inverting means comprises an EXCLUSIVE OR gate.

15. A digital divider as claimed in claim 14 wherein:
said counter means comprises a modulo 16 counter having a first output providing said digital output signal at a frequency of $\frac{1}{4}$ the frequency of said clock signal during integer division and a second output providing said second output signal at a frequency of 1/16 the frequency of said clock signal during integer division.

16. A digital divider as claimed in claim 15 wherein:
said counter has a preset state enabling input for setting said counter to a preset state upon receipt of a preset signal, said divider further comprising a preset logic gate having an output connected to said preset state enabling input, having a first input for receiving a third output signal from said counter, and having a second input for receiving said fractional division select signal, whereby said counter can be periodically preset when said fractional division select signal indicates selection of fractional division.

17. A digital divider for providing fractional division upon demand comprising:

a digital counter having 16 states and comprising an input for receiving input pulses and operating in normal operation to provide an output pulse at a first output for each n input pulses where n is an integer, said digital counter having a preset feature whereby said counter is set to a preset state upon receipt of a preset signal, first means for receiving an input signal comprising input pulses and providing said input pulses to said digital counter, said first means operating to selectively invert said input signal in response to a logic signal, the pulses being provided to said counter constituting a clock signal, logic means receiving a control signal from a control input and receiving a state signal from said counter, said logic means providing said logic signal and said preset signal in response to the received signals, whereby said first means for providing input pulses provides an extra half pulse upon a change of logic states of said logic signal thereby causing said counter to increment its count of input pulses by $\frac{1}{2}$.

* * * * *